United States Patent
Nagakubo et al.

(10) Patent No.: US 10,720,356 B2
(45) Date of Patent: Jul. 21, 2020

(54) SUBSTRATE PROCESSING APPARATUS AND METHOD OF TRANSFERRING SUBSTRATE

(71) Applicant: TOKYO ELECTRON LIMITED, Tokyo (JP)

(72) Inventors: Keiichi Nagakubo, Nirasaki (JP); Yoshiaki Sasaki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 240 days.

(21) Appl. No.: 15/708,351

(22) Filed: Sep. 19, 2017

(65) Prior Publication Data

US 2018/0082881 A1 Mar. 22, 2018

(30) Foreign Application Priority Data

Sep. 20, 2016 (JP) .................................. 2016-183132

(51) Int. Cl.
*H01L 21/687* (2006.01)
*H01L 21/67* (2006.01)
*H01L 21/677* (2006.01)
*H01L 21/68* (2006.01)

(52) U.S. Cl.
CPC .... *H01L 21/68707* (2013.01); *H01L 21/6719* (2013.01); *H01L 21/67167* (2013.01); *H01L 21/67259* (2013.01); *H01L 21/67265* (2013.01); *H01L 21/67742* (2013.01); *H01L 21/67754* (2013.01); *H01L 21/67778* (2013.01); *H01L 21/681* (2013.01)

(58) Field of Classification Search
CPC ............................................. H01L 21/67754
See application file for complete search history.

(56) References Cited

U.S. PATENT DOCUMENTS

| | | | | |
|---|---|---|---|---|
| 6,285,102 B1* | 9/2001 | Matsuoka | ............. | F16C 29/025 310/12.06 |
| 8,968,476 B2* | 3/2015 | Shin | .................. | C23C 16/45546 118/719 |
| 9,810,532 B2* | 11/2017 | Hashimoto | ............ | G01B 11/26 |
| 2014/0271057 A1* | 9/2014 | Weaver | ............. | H01L 21/67196 414/222.02 |
| 2015/0133044 A1* | 5/2015 | Kumagai | .......... | H01L 21/67109 454/284 |

FOREIGN PATENT DOCUMENTS

| JP | 2005142245 A | 6/2005 |
|---|---|---|
| JP | 2013-171871 A | 9/2013 |
| KR | 1020060035071 A | 4/2006 |
| KR | 1020130110889 A | 10/2013 |
| KR | 1020150084821 A | 7/2015 |

* cited by examiner

*Primary Examiner* — Michael S Lowe
(74) *Attorney, Agent, or Firm* — Nath, Goldberg & Meyer; Jerald L. Meyer

(57) ABSTRACT

There is provided a substrate processing apparatus having a transfer arm configured to transfer two substrates between a transfer chamber and a processing chamber having two mounting tables, the transfer arm holding the two substrates in a state where the two substrates overlap each other with a gap between the two substrates. The substrate processing apparatus includes: a lower substrate detection sensor configured to detect an edge portion of a lower substrate when the lower substrate is transferred; and an upper substrate detection sensor configured to detect an edge portion of an upper substrate when the upper substrate is transferred.

6 Claims, 16 Drawing Sheets

SUBSTRATE PROCESSING APPARATUS AND METHOD OF TRANSFERRING SUBSTRATE

CROSS-REFERENCE TO RELATED APPLICATION

This application is based upon and claims the benefit of priority from Japanese Patent Application No. 2016-183132, filed on Sep. 20, 2016, the entire contents of which are incorporated herein by reference.

TECHNICAL FIELD

The present disclosure relates to a substrate processing apparatus and a method of transferring a substrate, wherein two substrates are loaded into one processing chamber.

BACKGROUND

In a substrate processing apparatus for performing predetermined processing, for example, chemical oxide removal (COR) processing or post heat treatment (PHT) processing on a semiconductor wafer (hereinafter, simply referred to as "wafer") as a substrate, a plurality of process modules serving as processing chambers are arranged around a transfer module which is a common transfer chamber. While one wafer is transferred to one process module, the COR processing or PHT processing is performed on another wafer in another process module, thereby improving efficiency of the processing. In particular, since the COR processing or the PHT processing is a time-consuming process, two wafers are accommodated in each of the process modules, and the COR processing or the PHT processing is simultaneously performed on the two wafers.

In such a substrate processing apparatus, it is necessary to simultaneously transfer two wafers toward each process module, and thus, a transfer arm disposed within the transfer module holds the two wafers using a pick part installed at a tip of the transfer arm such that the two wafers overlap each other with a gap between the two wafers. Here, if the transfer arm holds only one wafer due to failure of delivery/reception of wafers or the like, only one wafer is loaded into each process module, so that the efficiency of the COR processing or PHT processing is lowered. Therefore, it is necessary to confirm whether the transfer arm holds two wafers before the wafers are loaded into each process module.

Accordingly, there is proposed a method of confirming whether the transfer arm holds two wafers. Specifically, a sensor including a light-emitting part for emitting laser light or red LED light and a light-receiving part is disposed in front of each process module within the transfer module. Each wafer held by the transfer arm is irradiated with the laser light or red LED light from the light-emitting part, and the light-receiving part detects whether the laser light or red LED light is blocked by the wafer, thereby confirming whether the transfer arm holds two wafers. At this time, since each wafer is obliquely irradiated with the laser light or red LED light from the light-emitting part, it is possible to confirm the presence of each wafer even though the transfer arm holds the two wafers while overlapping with each other.

Meanwhile, each process module has a stage for mounting each wafer thereon. If the wafer is not mounted at a correct location with respect to the stage, this is determined as an error and processing may be interrupted, so that it is necessary to correct a position of the wafer before the wafer is loaded into each process module. Conventionally, an orienter which is a position alignment device is provided to a loader module which is a standby transfer chamber connected to the transfer module, and the position of the wafer is corrected in the orienter. In this case, since it is necessary to reciprocate the wafer between the transfer module and the loader module, the efficiency of processing remarkably deteriorates. Therefore, it has been strongly required to correct the position of the wafer when the wafer is loaded from the transfer module into each process module.

However, in the aforementioned method, only one point on an edge of each wafer is detected by the sensor. If only one point on the edge is detected, a center position of the wafer cannot be specified so that the position of the wafer cannot be corrected.

SUMMARY

Some embodiments of the present disclosure provide a substrate processing apparatus and a method of transferring a substrate, wherein respective positions of two substrates arranged to overlap each other can be accurately specified.

According to one embodiment of the present disclosure, there is provided a substrate processing apparatus having a transfer arm configured to transfer two substrates between a transfer chamber and a processing chamber having two mounting tables, the transfer arm holding the two substrates in a state where the two substrates overlap each other with a gap between the two substrates, the substrate processing apparatus including: a lower substrate detection sensor configured to detect an edge portion of a lower substrate of the two substrates when the lower substrate is transferred; and an upper substrate detection sensor configured to detect an edge portion of an upper substrate of the two substrates when the upper substrate is transferred, wherein the transfer arm transfers the lower substrate between one of the mounting tables and the transfer chamber and transfers the upper substrate between the other of the mounting tables and the transfer chamber, the lower substrate detection sensor is an optical sensor having a light-emitting part and a light-receiving part, one of the light-emitting part and the light-receiving part is disposed in a region through which the lower substrate passes when the lower substrate is transferred, and is disposed to be placed between the lower substrate and the upper substrate, the other of the light-emitting part and the light-receiving part is disposed to face the one of the light-emitting part and the light-receiving part with the lower substrate interposed between the light-emitting part and the light-receiving part when the lower substrate is transferred, and the upper substrate detection sensor is disposed in a region through which the upper substrate passes when the upper substrate is transferred.

According to another embodiment of the present disclosure, there is provided a method of transferring two substrates between a transfer chamber and a processing chamber having two mounting tables by using a transfer arm, including: holding the two substrates by the transfer arm in a state where the two substrates overlap each other with a gap between the two substrates; transferring a lower substrate of the two substrates by the transfer arm between one of the mounting tables and the transfer chamber; and transferring an upper substrate of the two substrates by the transfer arm between the other of the mounting tables and the transfer chamber, wherein a lower substrate detection sensor configured to detect an edge portion of the lower substrate when the lower substrate is transferred, and an upper substrate detection sensor configured to detect an edge portion of the upper substrate when the upper substrate is transferred are disposed, the lower substrate detection sensor is an optical sensor having a light-emitting part and a light-receiving part, one of the light-emitting part and the light-receiving part is disposed in a region through which the lower substrate passes when the lower substrate is transferred, and is disposed to be placed between the lower substrate and the upper substrate, the other of the light-emitting part and the light-receiving part is disposed to face the one of the light-emitting part and the light-receiving part with the lower substrate interposed between the light-emitting part and the light-receiving part when the lower substrate is transferred, and the upper substrate detection sensor is disposed in a region through which the upper substrate passes when the upper substrate is transferred.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, one embodiment of the present disclosure will be described.

Figure 1:
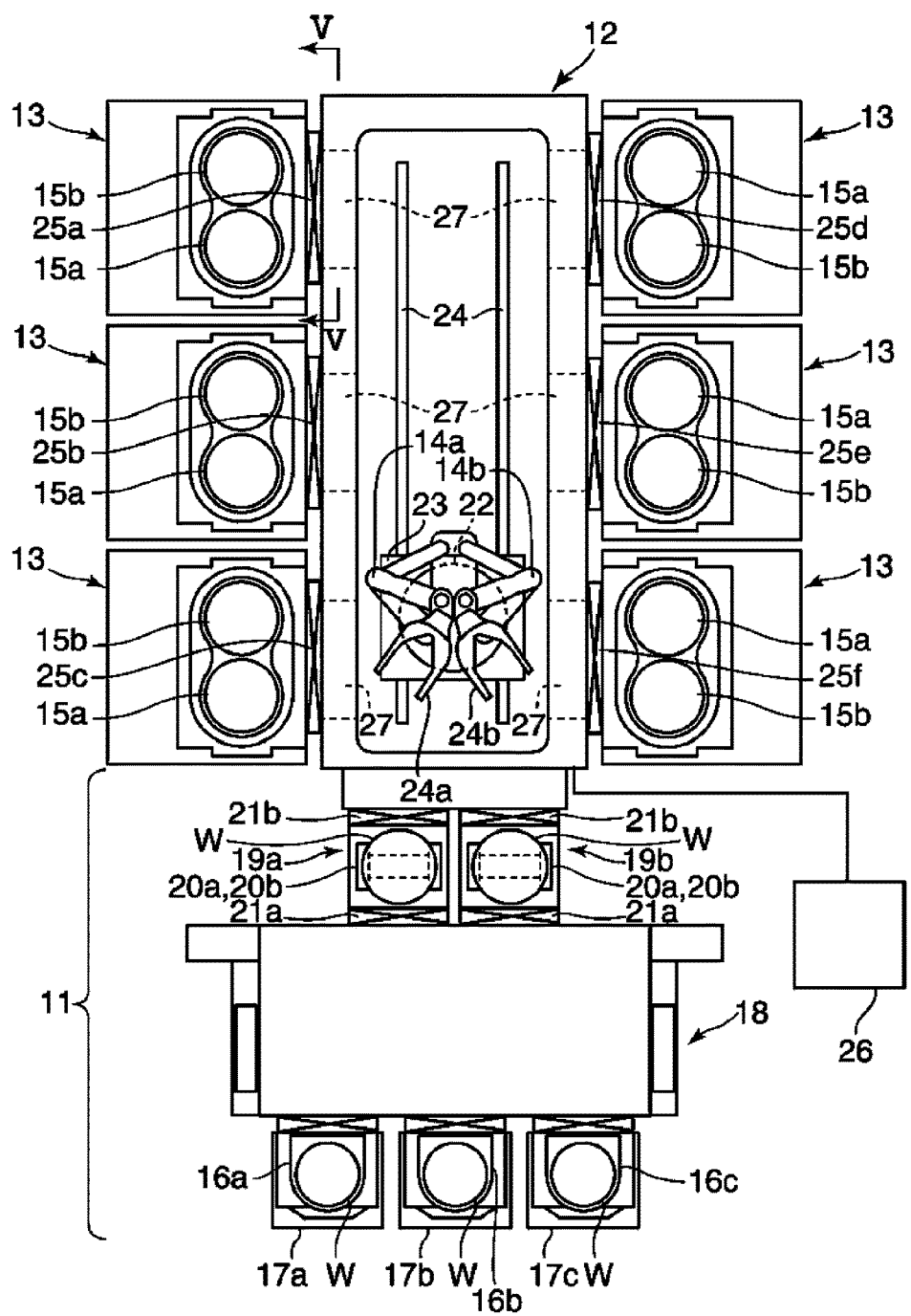
FIG. 1 is a plan view schematically showing a configuration of a substrate processing apparatus according to an embodiment of the present disclosure.

FIG. 1 is a plan view schematically showing a configuration of a substrate processing apparatus according to an embodiment of the present disclosure. For the sake of easy understanding, a portion of the internal components of the substrate processing apparatus are transmitted and shown in FIG. 1.

In FIG. 1, the substrate processing apparatus 10 includes a wafer storage part 11 for storing a plurality of wafers W therein, a common transfer part (transfer module) 12 serving as a transfer chamber for simultaneously transferring two wafers W, and a plurality of substrate processing parts (process modules) 13 serving as processing chambers in which predetermined processing, for example, COR processing or PHT processing is performed on the wafers W transferred from the transfer module 12. Interior portions of the process module 13 and the transfer module 12 are maintained in a vacuum atmosphere.

In the substrate processing apparatus 10, two selected wafers W among the plurality of wafers W stored in the wafer storage part 11 are held to overlap each other by a transfer arm 14a or 14b included in the transfer module 12, and the transfer arm 14a or 14b is moved so that each of the wafers W is transferred within the transfer module 12 and mounted on each of two stages 15a and 15b (mounting table) disposed inside the process module 13. Subsequently, in the substrate processing apparatus 10, after predetermined processing is performed on the respective wafers W mounted on the stages 15a and 15b in the process module 13, the two processed wafers W are held to overlap each other by the transfer arm 14a or 14b and then unloaded to the wafer storage part 11 by moving the transfer arm 14a or 14b.

The wafer storage part 11 includes load ports 17a to 17c which are mounting tables for FOUPs 16a to 16c serving as containers for storing the plurality of wafers W, a loader module 18 for receiving the stored wafer W from the FOUP 16a, 16b or 16c mounted on the load port 17a, 17b or 17c or delivering the wafer W subjected to the predetermined processing in the process module 13 to the FOUP 16a, 16b or 16c, and load lock modules 19a and 19b for temporarily holding the wafer W in order to receive and deliver the wafer W between the loader module 18 and the transfer module 12.

The loader module 18 is composed of a rectangular shaped housing having an interior maintained at atmospheric pressure, and the plurality of load ports 17a, 17b and 17c are arranged in parallel in one side surface constituting a long side of the rectangle. The loader module 18 has a transfer arm (not shown) which is movable therein in a longitudinal direction of the rectangle. The transfer arm transfers the wafer W from the FOUPs 16a, 16b and 16c mounted on the load port 17a, 17b and 17c to the load lock module 19a, or unloads the wafer W from the load lock module 19b to the FOUPs 16a, 16b and 16c. The FOUPs 16a, 16b and 16c accommodate a plurality of wafers W that are placed at equal intervals while overlapping each other. Interiors of the FOUPs 16a, 16b and 16c mounted on the load port 17a, 17b and 17c are usually filled with atmospheric air, but may be filled with nitrogen gas or the like and then air-tightly sealed.

The load lock module 19a temporarily holds the wafer W so as to hand over the wafer W accommodated in the FOUPs 16a, 16b and 16c mounted on the load port 17a, 17b and 17c having an interior maintained at atmospheric pressure, to the process module 13 having an interior maintained at a vacuum atmosphere. The load lock module 19a has an upper stocker 20a and a lower stocker 20b which hold two wafers W while making the two wafers W overlap each other. The load lock module 19a further has a gate valve 21a for securing airtightness with respect to the loader module 18 and a gate valve 21b for securing airtightness with respect to the transfer module 12. Furthermore, a gas introduction system and a gas exhaust system (not shown) are connected to the load lock module 19a via a pipeline, so that interior of the load lock module is controlled to be in an atmospheric pressure atmosphere or a vacuum atmosphere by the gas introduction system and the gas exhaust system. The load lock module 19b has the same configuration as the load lock module 19a.

The transfer module 12 transfers an unprocessed wafer W from the wafer storage part 11 to the process module 13 and unloads the processed wafer W from the process module 13 to the wafer storage part 11. The transfer module 12 is composed of a housing which is in the shape of a rectangle and of which interior is maintained in a vacuum atmosphere. The transfer module 12 includes transfer arms 14a and 14b each of which holds two wafers W while making the two wafers W overlap each other, a rotary table 22 for rotatably supporting the transfer arms 14a and 14b, a rotary mounting table 23 with the rotary table 22 mounted thereon, and guide rails 24 for movably guiding the rotary mounting table 23 in a longitudinal direction of the transfer module 12. The transfer module 12 communicates with the load lock modules 19a and 19b of the wafer storage part 11 and the respective process modules 13 via the gate valves 21a and 21b as well as gate valves 25a to 25f to be described later. In the transfer module 12, the transfer arm 14a receives two overlapping wafers W which are held in the overlapping state by the upper stocker 20a and the lower stocker 20b in the load lock module 19a, and then transfers the wafers to each process module 13. Further, the transfer arm 14b holds the two wafers W, which have been subjected to processing in the process module 13, while making the two wafers W overlap each other and unloads the two wafers W to the load lock module 19b.

Figure 2A:
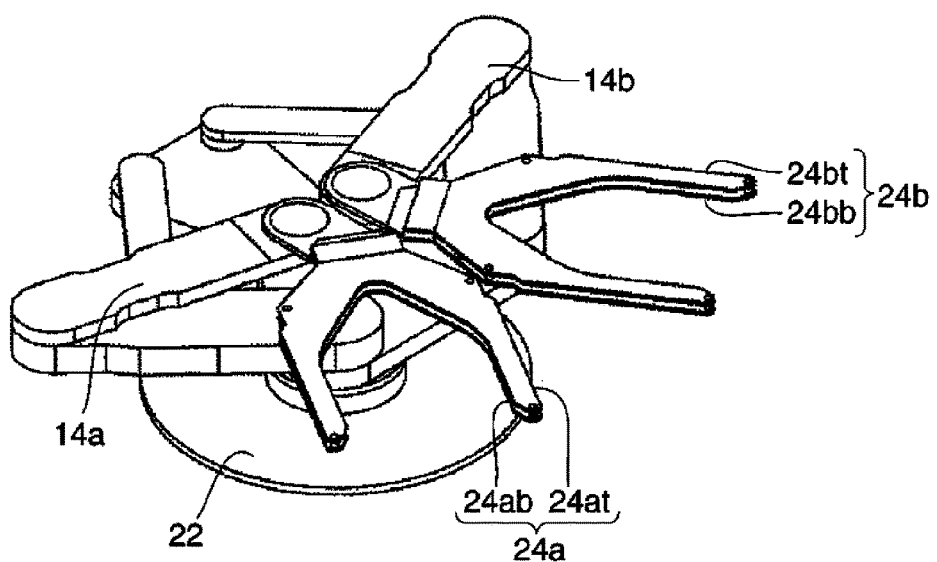
FIGS. 2A and 2B are views illustrating a configuration of a transfer arm in FIG. 1.
Figure 2B:
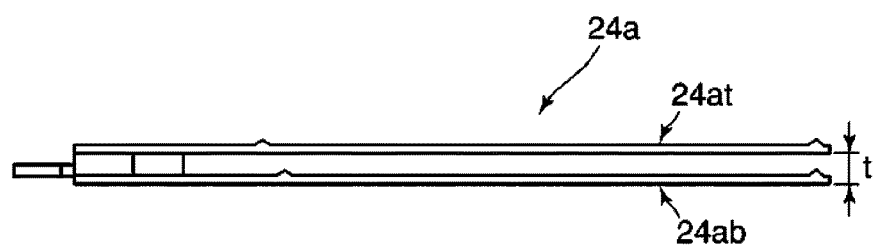

FIGS. 2A and 2B are views illustrating a configuration of the transfer arm in FIG. 1. FIG. 2A is a perspective view showing the entire transfer arm. FIG. 2B is a side view of a pick part of the transfer arm.

In FIGS. 2A and 2B, the transfer arm 14a and the transfer arm 14b have pick parts 24a and 24b at tips thereof, respectively, to mount two wafers W on each of the pick parts. The transfer arm 14a has a link mechanism in which a plurality of rectangular link portions (linkages) are rotatably connected to one another at a plurality of joint (articulation) portions. One end of the link mechanism of the transfer arm 14a is rotatably supported by the rotary table 22. The other end of the link mechanism of the transfer arm 14a is a free end, and the pick part 24a is connected to the other end (FIG. 2A).

The pick part 24a has a configuration in which an upper pick 24at and a lower pick 24ab having a bifurcated fork shape are stacked and spaced apart from each other by a predetermined distance t (FIG. 2B). In the pick part 24a, one wafer W is mounted on an upper surface of the upper pick 24at and one wafer W is also mounted on an upper surface of the lower pick 24ab (between the upper pick 24at and the lower pick 24ab). In other words, the transfer arm 14a holds the two wafers W by using the pick part 24a in a state where the two wafers W overlap each other with a gap between the two wafers W. The pick part 24b has a configuration in which an upper pick 24bt and a lower pick 24bb having a bifurcated fork shape are stacked and spaced apart from each other by a predetermined distance t, and has the same configuration as the pick part 24a.

Due to rotation of the one end of the link mechanism and movement of the other end of the link mechanism, the transfer arm 14a transfers the respective wafers W mounted on the pick part 24a formed at the other end to a desired location. Furthermore, the transfer arm 14b has the same configuration as the transfer arm 14a. Since two wafers W are mounted on the transfer arms 14a and 14b at the same time, the substrate processing apparatus 10 can simultaneously transfer four wafers W using the transfer arms 14a and 14b. The rotary table 22 rotatably supports the transfer arms 14a and 14b about a vertical rotation axis.

Turning to FIG. 1, the rotary mounting table 23 and the guide rails 24 constitute a sliding mechanism for moving the mounted rotary table 22 in the longitudinal direction in the transfer module 12.

The respective process modules 13 communicate with the transfer module 12 via the gate valves 25a to 25f. Therefore, the gate valves 25a to 25f allow securement of airtightness between each process module 13 and the transfer module 12 and communication therebetween. Further, a gas introduction system (a supply source of a gas such as a processing gas, a purge gas and the like) and a gas exhaust system (a vacuum pump, an exhaust control valve, an exhaust pipe and the like) which are not shown in the figures are connected to the process modules 13.

Each process module 13 has the stages 15a and 15b (two mounting tables) for mounting two wafers W thereon in a state where the wafers are arranged in a horizontal direction. Each process module 13 uniformly and simultaneously processes surfaces of the two wafers W by mounting the wafers W in the arranged state on the stages 15a and 15b. In this embodiment, each of the plurality of process modules 13 performs any one of COR processing and PHT processing.

The substrate processing apparatus 10 further includes a controller 26 as a control part. The controller 26 executes a program stored in a memory incorporated therein to control operations of respective components of the substrate processing apparatus 10.

FIGS. 3A to 3E are process views illustrating transfer of wafers toward the interior of the process module by the transfer arm.

Figure 3A:
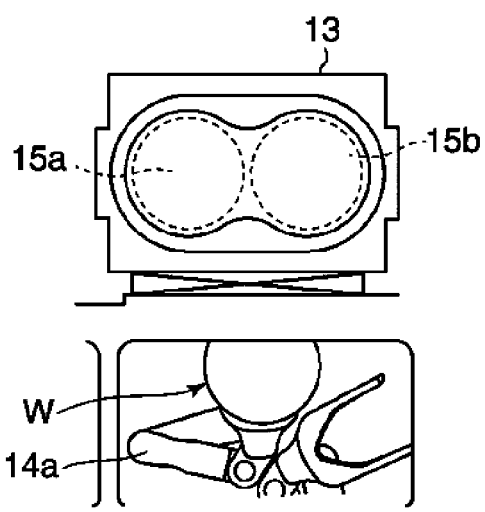
FIGS. 3A to 3E are process views illustrating transfer of wafers toward an interior of a process module by the transfer arm.
Figure 3B:
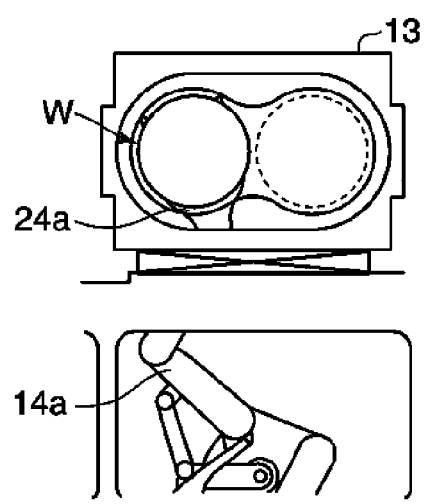
Figure 3C:
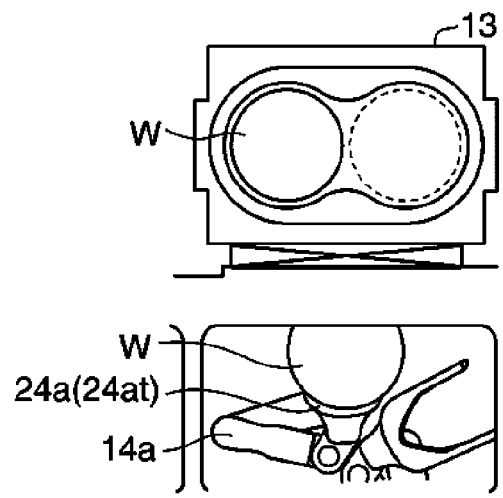

First, the transfer arm 14a which holds the two wafers W while making the two wafers W overlap each other is moved to the front of one process module 13 (FIG. 3A). The link mechanism of the transfer arm 14a extends such that the pick part 24a enters the process module 13 and causes the wafer W mounted on the lower pick 24ab (hereinafter, referred to as "lower wafer W") to face the stage 15a (FIG. 3B). At this time, the stage 15a receives the lower wafer W using lift pins or the like (not shown) and mounts the lower wafer W on an upper surface of the stage 15a (a first transfer step). Thereafter, due to retraction of the link mechanism, the pick part 24a of the transfer arm 14a is withdrawn from the interior of the process module 13 (FIG. 3C). At this time, the pick part 24a holds only the wafer W mounted on the upper pick 24at (hereinafter, referred to as "upper wafer W").

Figure 3D:
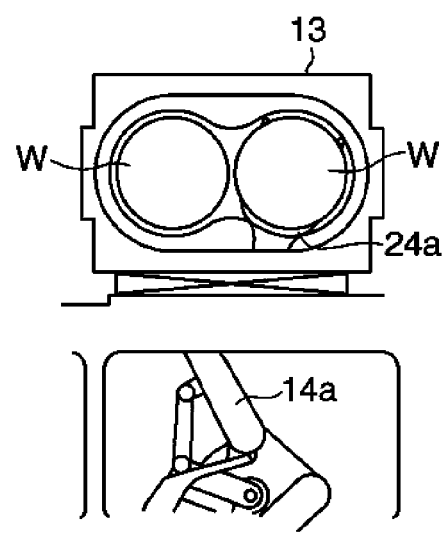
Figure 3E:
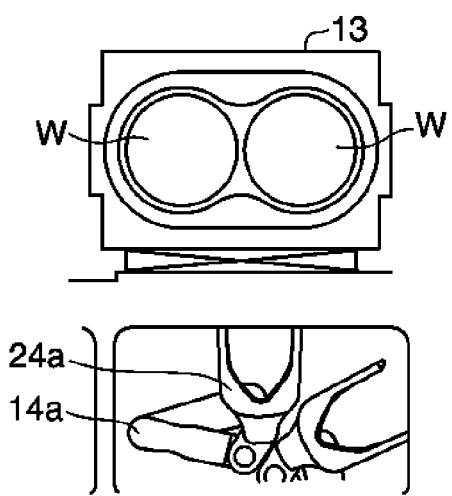

Subsequently, the link mechanism of the transfer arm 14a extends such that the pick part 24a enters the process module 13 again and causes the upper wafer W to face the stage 15b (FIG. 3D). At this time, the stage 15b receives the upper wafer W using the lift pins or the like (not shown) and mounts the upper wafer W on an upper surface of the stage 15b (a second transfer step). Thereafter, due to the retraction of the link mechanism, the pick part 24a of the transfer arm 14a is withdrawn from the interior of one process module 13 (FIG. 3E). At this time, the pick part 24a holds no wafer W.

Meanwhile, in the substrate processing apparatus 10, if each wafer W is not mounted at a correct location on the stage 15*a* or 15*b*, it is determined as an error and processing in each process module 13 is interrupted. Therefore, it is necessary to accurately specify the position of the wafer W before the wafer W is transferred to each process module 13 and to correct a position of the wafer W if the position of the wafer W is misaligned from a desired position. In particular, from the viewpoint of prevention of degradation of throughput, it is preferable to specify the position of the wafer W and to modify the position of the wafer W when the wafer W is transferred by the transfer arms 14*a* and 14*b* (in particular, the step shown in FIG. 3B or 3D). Correspondingly, as will be described later, in the present embodiment, a sensor for detecting an edge portion (edge) of the wafer W is installed in front of each process module 13, so that the sensor detects two points on the edge portion of the wafer W so as to specify the position of the wafer W when the wafer is transferred into the process module 13 by the transfer arms 14*a* and 14*b*.

Figure 4A:
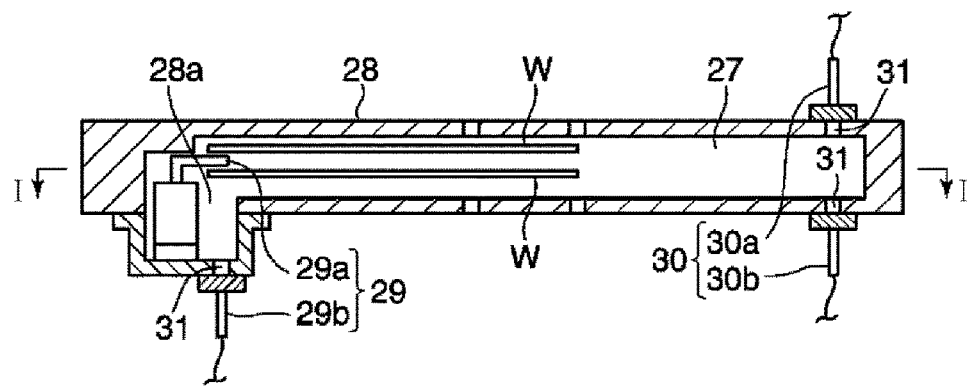
FIGS. 4A and 4B are views illustrating a communication port for communicating an interior of the transfer module with the interior of the process module.
Figure 4B:
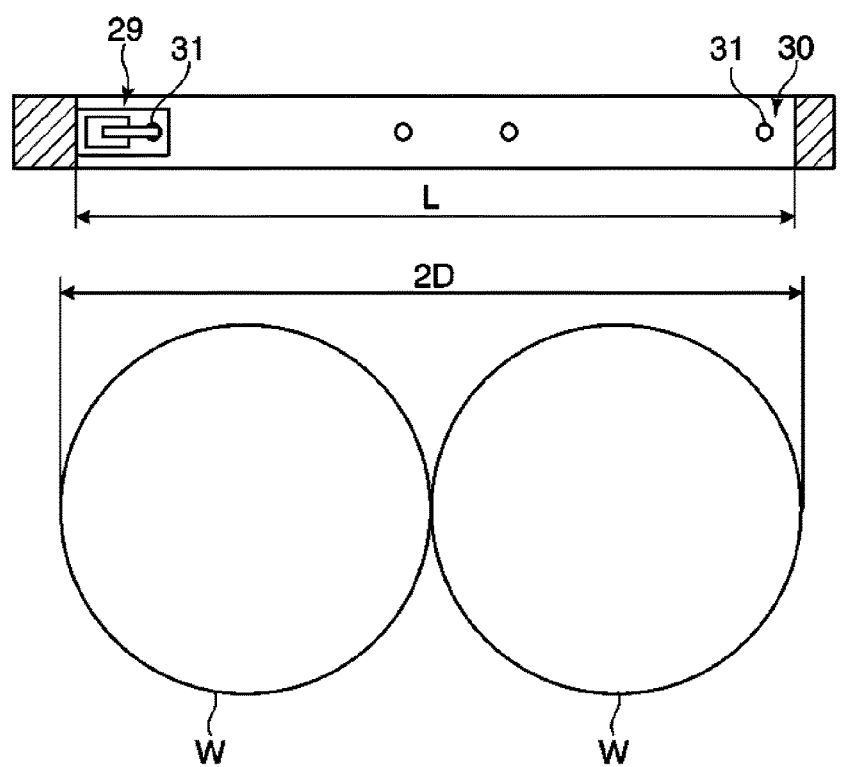

FIGS. 4A and 4B are views illustrating a communication port for communicating the interior of the transfer module with the interior of the process module. FIG. 4A is a sectional view taken along line V-V in FIG. 1. FIG. 4B is a sectional view taken along line I-I in FIG. 4A. Specifically, FIG. 4A shows a vertical cross section of a communication port 27 provided in a wall portion of the transfer module 12 and FIG. 4B shows a horizontal cross section of the communication port 27.

In FIG. 1, the communication port 27 (opening) for communicating the interior of the transfer module 12 with the interior of each process module 13 is formed in the wall portion of the transfer module 12. Moreover, the gate valves 25*a* to 25*f* are interposed between the communication ports 27 and the process modules 13, respectively. Since the respective communication ports 27 and the interior of the transfer module 12 communicate with each other, interiors of the communication ports 27 are maintained in a vacuum atmosphere.

The communication port 27 is an elongated hole of which the cross section extends along the longitudinal direction (hereinafter, referred to as "horizontal direction") of the transfer module 12 and is surrounded by a container-shaped flange 28 protruding from the wall portion of the transfer module 12. A width L of the communication port 27 is smaller than a total width 2D of two wafers W when the two wafers W are arranged in the horizontal direction. Therefore, it is impossible to transfer the two wafers W to the interior of the process module 13 in the state where the two wafers W are arranged in the horizontal direction.

A lower wafer detection sensor 29 for detecting an edge (edge portion) of the lower wafer W and an upper wafer detection sensor 30 for detecting an edge portion of the upper wafer W are arranged in the flange 28. The lower wafer detection sensor 29 is an optical sensor having a set of a light-emitting part 29*a* and a light-receiving part 29*b*. The light-receiving part 29*b* receives laser light or red LED light emitted from the light-emitting part 29*a*. In the flange 28, when viewed from above along a direction in which the lower wafer W and the upper wafer W overlap each other (hereinafter, referred to as "overlapping direction"), the light-emitting part 29*a* is disposed in a region through which the lower wafer W passes when the lower wafer W is transferred toward the interior of the process module 13, and is also disposed to be placed between the lower wafer W and the upper wafer W when the lower wafer W is transferred toward the interior of the process module 13; and the light-receiving part 29*b* is disposed to face the light-emitting part 29*a* with the lower wafer W interposed between the light-receiving part 29*b* and the light-emitting part 29*a*. In the lower wafer detection sensor 29, only the lower wafer W passes between the light-emitting part 29*a* and the light-receiving part 29*b*, and the upper wafer W does not pass between the light-emitting part 29*a* and the light-receiving part 29*b*. In the lower wafer detection sensor 29, blockage of the laser light or red LED light when the edge portion of the lower wafer W passes between the light-emitting part 29*a* and the light-receiving part 29*b* is detected, thereby detecting passage of the edge portion of the lower wafer W between the light-emitting part 29*a* and the light-receiving part 29*b*. A position of the edge portion of the lower wafer W that has blocked the laser light or red LED light is specified based on an encoder value of a motor of the transfer arm 14*a* at this time or a position of the lower wafer detection sensor 29.

The upper wafer detection sensor 30 is also an optical sensor having a set of a light-emitting part 30*a* and a light-receiving part 30*b*. In the flange 28, when viewed from above along the overlapping direction, the upper wafer detection sensor 30 is disposed in a region through which the upper wafer W passes when the upper wafer W is transferred toward the stage 15*b*. Further, the light-emitting part 30*a* and the light-receiving part 30*b* are provided on the flange 28 to face each other with the communication port 27 interposed between the light-emitting part 30*a* and the light-receiving part 30*b*. In the upper wafer detection sensor 30, the upper wafer W passes between the light-emitting part 30*a* and the light-receiving part 30*b*. Moreover, since the pick part 24*a* of the transfer arm 14*a* does not hold the lower wafer W when the upper wafer W is transferred toward the stage 15*b*, the lower wafer W does not pass between the light-emitting part 30*a* and the light-receiving part 30*b*. In the upper wafer detection sensor 30, the blockage of the laser light or red LED light when the edge portion of the upper wafer W passes between the light-emitting part 30*a* and the light-receiving part 30*b* is detected, thereby detecting passage of the edge portion of the upper wafer W between the light-emitting part 30*a* and the light-receiving part 30*b*. A position of the edge portion of the upper wafer W that has blocked the laser light or red LED light is specified based on the encoder value of the motor of the transfer arm 14*a* at this time or a position of the upper wafer detection sensor 30.

In the flange 28, the light-receiving part 29*b*, the light-emitting part 30*a* and the light-receiving part 30*b* are disposed outside the communication port 27 and directed to an interior of the communication port 27 through respective sensor windows 31 provided on the flange 28 or a bracket 32 to be described later. Since the light-emitting part 29*a* is positioned between the lower wafer W and the upper wafer W when the lower wafer W is transferred toward the interior of the process module 13, the light-emitting part 29*a* is disposed within the communication port 27, i.e., in a vacuum atmosphere.

Figure 5:
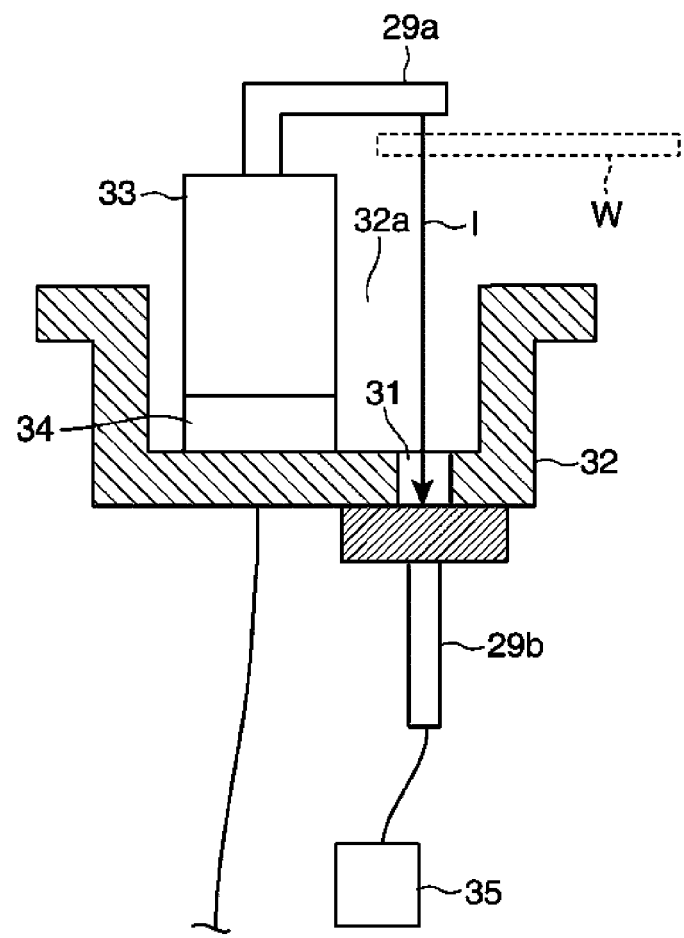
FIG. 5 is an enlarged sectional view schematically showing a configuration of a lower wafer detection sensor in FIGS. 4A and 4B.

FIG. 5 is an enlarged sectional view schematically showing the configuration of the lower wafer detection sensor in FIGS. 4A and 4B.

In FIG. 5, the lower wafer detection sensor 29 includes the cup-shaped bracket 32; the light-emitting part 29*a* which is bent in an inverted L-shape when viewed from a side and radiates the laser light 1 (or red LED light) downward in the figure from a tip thereof; the light-receiving part 29*b* which is provided outside of and at a bottom of the bracket 32 and faces the tip of the light-emitting part 29*a* via the sensor window 31; and an assembly member 33 for supporting and holding the light-emitting part 29*a*. The assembly member 33 is mounted inside of and on the bracket 32 via a shim 34.

In other words, since the light-emitting part 29a is elevated and held by the shim 34 and the assembly member 33 from the bracket 32, the light-emitting part 29a protrudes upward from the bracket 32. A size of an opening 32a of the bracket 32 corresponds to a size of a sensor port 28a formed on a lower side of the flange 28. The lower wafer detection sensor 29 is mounted on the flange 28 by installing the bracket 32 below the flange 28 such that the opening 32a and the sensor port 28a face each other. As described above, since the light-emitting part 29a protrudes upward from the bracket 32, when the lower wafer detection sensor 29 is mounted on the flange 28, the light-emitting part 29a protrudes into the interior of the communication port 27. Accordingly, the light-emitting part 29a is disposed to be placed between the lower wafer W and the upper wafer W.

Further, when viewed along an installation direction (a vertical direction in the figure) of the lower wafer detection sensor 29, the size of the light-emitting part 29a is set so as not to protrude from the opening 32a of the bracket 32, in other words, not to protrude from the sensor port 28a of the flange 28. Accordingly, when the lower wafer detection sensor 29 is mounted on the flange 28, the light-emitting part 29a does not interfere with the flange 28.

In the lower wafer detection sensor 29, an adhesive having low-degassing property is provided to bond the components thereof, and the assembly member 33 or the shim 34 is formed of low-carbon stainless steel, e.g., SUS 316L. Accordingly, it is possible to prevent an adverse influence on the processed wafer W due to a gas or carbon released from the lower wafer detection sensor 29. In addition, the tip of the light-emitting part 29a is composed of a heat resistant member, e.g., a member having a heat resistant temperature of 300 degrees C. or higher. This makes it possible to inhibit the tip of the light-emitting part 29a from being thermally deformed by radiant heat from the lower or upper wafer W, thereby preventing the laser light (or red LED light) 1 from being unable to be radiated toward the light-receiving part 29b. Further, a light-received amount monitor 35 for measuring a received amount of the laser light (or red LED light) 1 is connected to the light-receiving part 29b. When the received amount of the laser light (or red LED light) 1 is decreased due to a deposition adhered to the light-emitting part 29a or the light-receiving part 29b so that the received amount falls below a predetermined threshold value, the light-received amount monitor 35 issues a warning, which urges a user to pay attention to cleaning, to the controller 26 or issues a signal for requesting interruption of the transfer of the lower wafer W. Although the light-emitting part 29a is disposed above the light-receiving part 29b in the lower wafer detection sensor 29, there is no particular limitation on a vertical positional relationship between the light-emitting part 29a and the light-receiving part 29b. For example, the light-emitting part 29a may be disposed below the light-receiving part 29b.

Figure 6A:
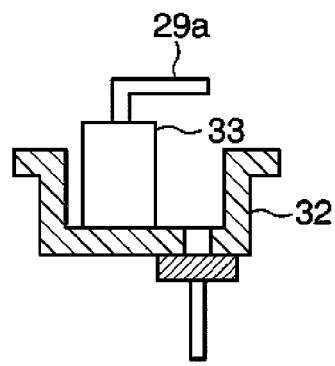
FIGS. 6A to 6C are process views illustrating a method of mounting the lower wafer detection sensor to a flange.
Figure 6B:
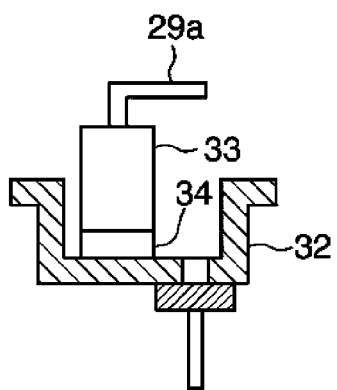
Figure 6C:
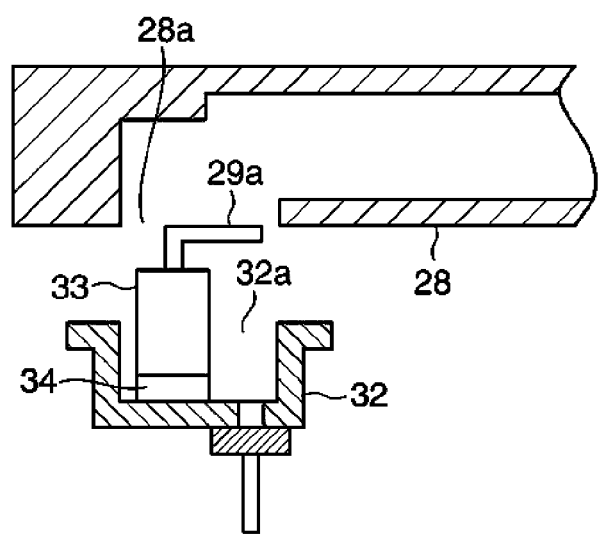

FIGS. 6A to 6C are process views illustrating a method of mounting the lower wafer detection sensor to the flange.

First, after the light-emitting part 29a is mounted on the bracket 32, a height of the light-emitting part 29a is measured in a state where the shim 34 is not disposed between the assembly member 33 and the bracket 32 (FIG. 6A), and the shim 34 having a required thickness is selected. Subsequently, the assembly member 33 is installed on the bracket 32 via the selected shim 34 (FIG. 6B). Thereafter, the bracket 32 is installed on the lower side of the flange 28 such that the opening 32a and the sensor port 28a face each other, whereby the lower wafer detection sensor 29 is mounted on the flange 28 (FIG. 6C). As described above, the size of the light-emitting part 29a is set so as not to protrude from the sensor port 28a of the flange 28 when viewed along the installation direction of the lower wafer detection sensor 29, and the bracket 32 is also installed on the flange 28 in the state where the light-emitting part 29a and the light-receiving part 29b are mounted on the bracket 32, so that the lower wafer detection sensor 29 can be easily mounted on the flange 28 in a simple process.

FIGS. 7A to 7D and 8A to 8D are process views illustrating a method of transferring substrates according to an embodiment of the present disclosure. In order to clearly distinguish the wafer W from the stages 15a and 15b in FIGS. 7A to 7D and 8A to 8D, the stages 15a and 15b are indicated by crosshatching. In FIGS. 7A to 7D and 8A to 8D, the transfer arm 14a, the process module 13 and the transfer module 12 are not shown.

Curves $C_1$ and $C_2$ indicated by thin broken lines in FIGS. 7A to 7D and 8A to 8D are respective transfer routes of the lower wafer W and the upper wafer W when the respective wafers W are transferred to the interior of the process module 13. From the viewpoint of improvement of throughput, it is preferable to linearly move the respective wafers W. In this embodiment, each of the wafers W is moved along a curved route so as to transfer the wafer W toward the stages 15a or 15b through the shortest distance while avoiding interference with the components and the like disposed within the process module 13.

Figure 7A:
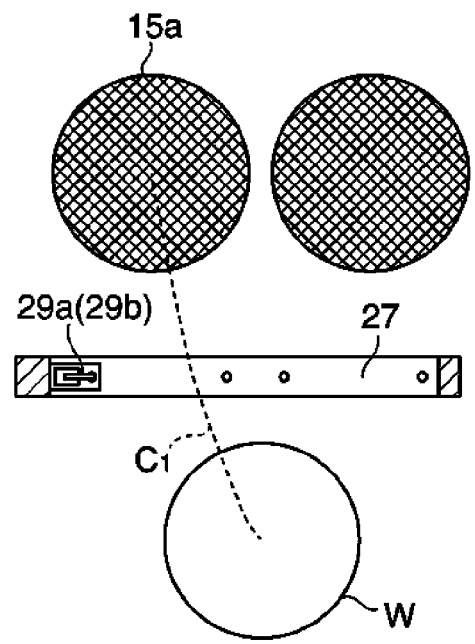
FIGS. 7A to 7D are process views illustrating a method of transferring substrates according to an embodiment of the present disclosure.
Figure 7B:
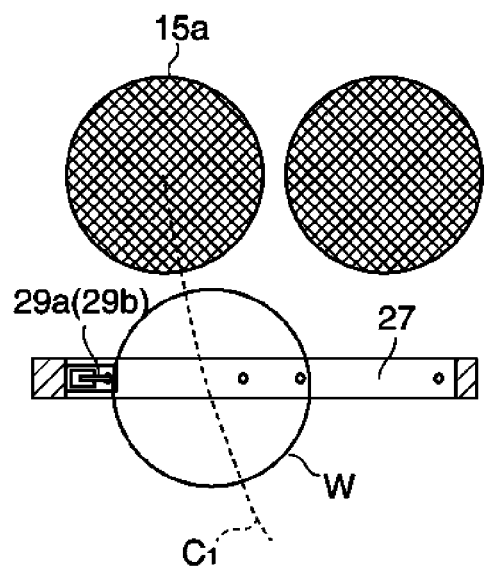

First, the lower wafer W and the upper wafer W are held by the transfer arm 14a while overlapping each other (a holding step) and the transfer arm 14 is moved to the front of one process module 13 (FIG. 7A). Subsequently, the link mechanism of the transfer arm 14a extends to move the lower wafer W and the upper wafer W held by the pick part 24a toward the stage 15a (one of the mounting tables) via the communication port 27 (a first transfer step). In this embodiment, since the light-emitting part 29a of the lower wafer detection sensor 29 is disposed to be placed between the lower wafer W and the upper wafer W and the light-receiving part 29b is disposed to face the light-emitting part 29a with the lower wafer W interposed between the light-receiving part 29b and the light-emitting part 29a, one point on the edge portion of the lower wafer W first passes between the light-emitting part 29a and the light-receiving part 29b of the lower wafer detection sensor 29 (FIG. 7B). At this time, the passage of the lower wafer W is detected and a position of the one point on the edge portion of the lower wafer W is specified.

Figure 7C:
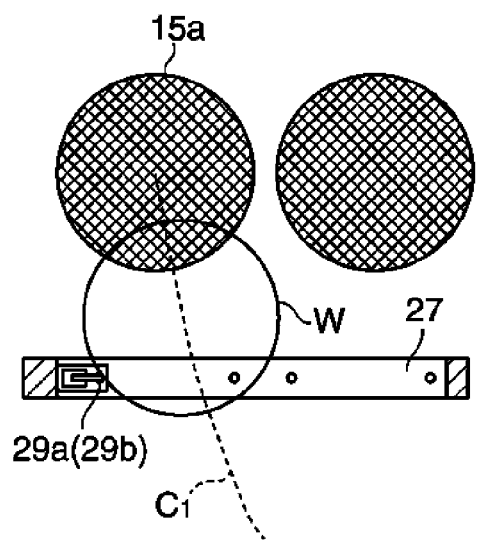
Figure 7D:
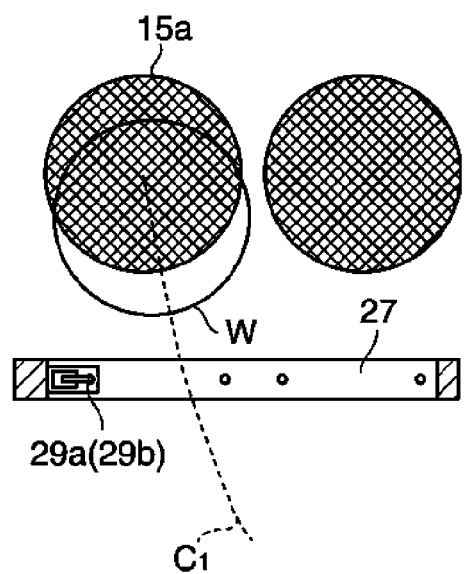
Figure 9:
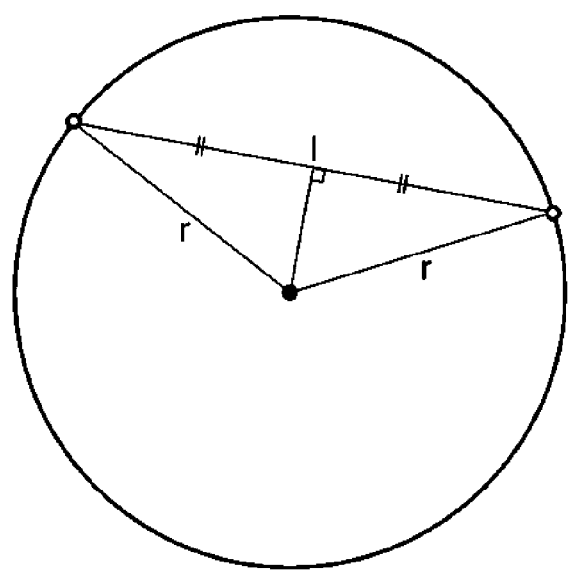
FIG. 9 is a view illustrating a method of specifying a center position of a circle.

Thereafter, when the lower wafer W is continuously transferred, the light-emitting part 29a is disposed in a region through which the lower wafer W passes, so that the other point on the edge portion of the lower wafer W passes between the light-emitting part 29a and the light-receiving part 29b (FIG. 7C). At this time, this passage of the lower wafer W is also detected and a position of the other point on the edge portion of the lower wafer W is specified. Accordingly, the positions of the two points on the edge portion of the lower wafer W are specified. In general, when positions of two points on a circumference of a circle are specified and a radius r of the circle is known, as shown in FIG. 9, a vertex (black dot in FIG. 9) of an isosceles triangle having a line 1, which connects the two points (white dots in FIG. 9) of which positions have been specified, as a base line and the radius r as a hypotenuse becomes a center of the circle. Therefore, even in this embodiment, it is possible to specify a center position of the lower wafer W based on the positions of two specified points on the edge portion of the lower wafer W and the radius of the lower wafer W. Thereafter, the position of the lower wafer W is corrected based on misalignment between the specified center position of the lower wafer W and a desired center position of the lower wafer W. Specifically, even after the positions of the two points on the edge portion of the lower wafer W are specified, the lower wafer W is continuously transferred toward the stage 15a (FIG. 7D). At this time, the position of the lower wafer W is corrected. Thereafter, the lower wafer W is mounted on the upper surface of the stage 15a.

Figure 8A:
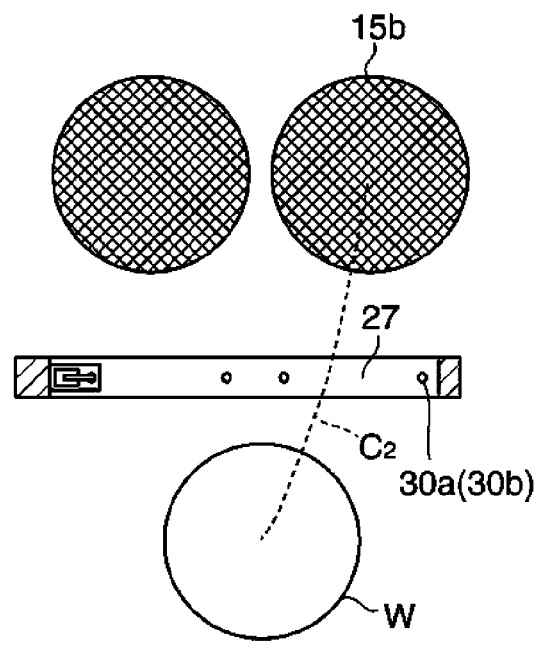
FIGS. 8A to 8D are process views illustrating the method of transferring substrates according to the embodiment of the present disclosure.
Figure 8B:
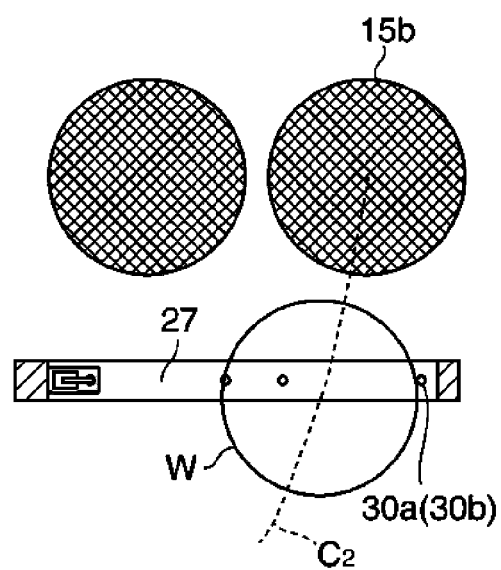

Subsequently, due to the retraction of the link mechanism, the pick part 24a of the transfer arm 14a is withdrawn from the interior of one process module 13. At this time, the pick part 24a holds only the upper wafer W (FIG. 8A). Thereafter, the link mechanism of the transfer arm 14a extends to move the upper wafer W toward the stage 15b via the communication port 27 (a second transfer step). In this embodiment, since the upper wafer detection sensor 30 is disposed in a region through which the upper wafer W passes when viewed from above along the overlapping direction, one point on the edge portion of the upper wafer W first passes between the light-emitting part 30a and the light-receiving part 30b of the upper wafer detection sensor 30 (FIG. 8B). At this time, the passage of the upper wafer W is detected and a position of the one point of the upper wafer W is specified.

Figure 8C:
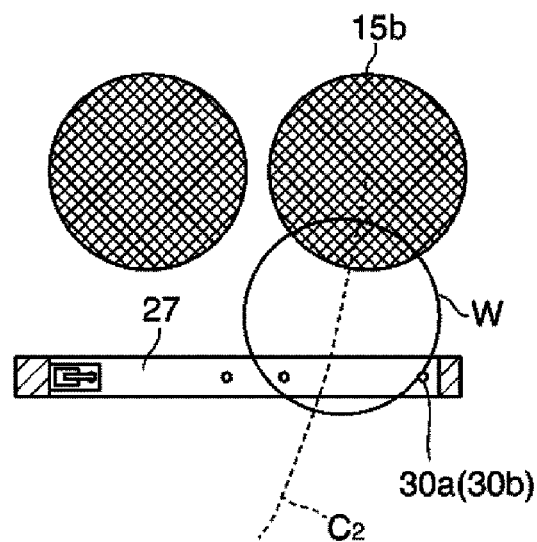
Figure 8D:
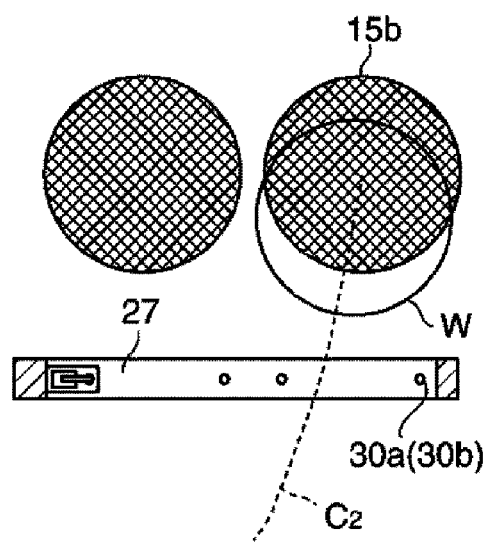

Thereafter, when the upper wafer W is continuously transferred, the light-emitting part 30a is disposed in a region through which the upper wafer W passes, so that the other point on the edge portion of the upper wafer W passes between the light-emitting part 30a and the light-receiving part 30b (FIG. 8C). At this time, this passage of the upper wafer W is also detected and a position of the other point on the edge portion of the upper wafer W is specified. Accordingly, the positions of the two points on the edge portion of the upper wafer W are specified. Then, in the same manner as the center position of the lower wafer W, it is possible to specify a center position of the upper wafer W based on the positions of two specified points on the edge portion of the upper wafer W and the radius of the upper wafer W. Subsequently, the position of the upper wafer W is corrected based on misalignment between the specified center position of the upper wafer W and a desired center position of the upper wafer W. Specifically, even after the positions of the two points on the edge portion of the upper wafer W are specified, the upper wafer W is continuously transferred toward the stage 15b (FIG. 8D). At this time, the position of the upper wafer W is corrected. Thereafter, the upper wafer W is mounted on the upper surface of the stage 15b.

Subsequently, due to the retraction of the link mechanism, the pick part 24a of the transfer arm 14a is withdrawn from the interior of one process module 13. Then, the method is terminated.

According to the substrate processing apparatus 10 described above, since the light-emitting part 29a of the lower wafer detection sensor 29 is disposed to be placed between the lower wafer W and the upper wafer W when the lower wafer W is transferred toward the interior of the process module 13 and the light-receiving part 29b is disposed to face the light-emitting part 29a with the lower wafer W interposed between the light-receiving part 29b and the light-emitting part 29a, only the lower wafer W passes between the light-emitting part 29a and the light-receiving part 29b. Accordingly, the lower wafer detection sensor 29 can detect the edge portion of the lower wafer W, irrespective of the presence of the upper wafer W. Moreover, since the light-emitting part 29a is disposed in the region through which the lower wafer W passes when the lower wafer W is transferred toward the interior of the process module 13, the edge portion of the lower wafer W passes twice between the light-emitting part 29a and the light-receiving part 29b. Accordingly, it is possible to specify the positions of the two points on the edge portion of the lower wafer W. Furthermore, since the upper wafer detection sensor 30 is disposed in the region through which the upper wafer W passes when the upper wafer W is transferred toward the interior of the process module 13, the edge portion of the upper wafer W passes twice between the light-emitting part 30a and the light-receiving part 30b of the upper wafer detection sensor 30. Accordingly, it is possible to specify the positions of the two points on the edge portion of the upper wafer W. As a result, it is possible to accurately specify the respective positions of the two wafers W disposed in the overlapping state by using the method of specifying the center position of the circle as shown in FIG. 9.

In the substrate processing apparatus 10, when the received amount of the laser light (or red LED light) 1 received by the light-receiving part 29b of the lower wafer detection sensor 29 falls below the predetermined threshold value, since the light-received amount monitor 35 issues the warning, which urges a user to pay attention to cleaning, to the controller 26 or issues the signal for requesting the interruption of the transfer of the lower wafer W, it is possible to prevent a failure in specifying the position of the edge portion of the lower wafer W due to a decrease in the amount of the laser light (or red LED light) 1.

Although the embodiments of the present disclosure have been described above, the present disclosure is not limited to these embodiments.

For example, in the embodiments of the present disclosure, the method of specifying the center position of the lower wafer W and the method of specifying the center position of the upper wafer W when the lower wafer W and the upper wafer W are transferred from the transfer module 12 to the interior of the process module 13 (FIGS. 7A to 7D and 8A to 8D) have been described above. However, it is possible to specify the center position of the lower wafer W and the center position of the upper wafer W by using the same method as that illustrated in FIGS. 7A to 7D and 8A to 8D even when the lower wafer W and the upper wafer W are transferred from the interior of the process module 13 to the transfer module 12. Even in this case, the lower wafer W is first transferred and the upper wafer W is then transferred.

Furthermore, in the substrate processing apparatus 10, when the edge portion of the lower wafer W passes between the light-emitting part 29a and the light-receiving part 29b, or when the edge portion of the upper wafer W passes between the light-emitting part 30a and the light-receiving part 30b, a moving speed of the lower wafer W or the upper wafer W may be lowered. Thus, it is possible to enhance detection sensitivity of the passage of each of the wafers W. In addition, after the lower wafer W has been subjected to the PHT processing as a heat treatment, it is preferable to lower a transfer speed of the lower wafer W when the lower wafer W passes between the light-emitting part 29a and the light-receiving part 29b of the lower wafer detection sensor 29. Accordingly, a deposition adhered to the light-emitting part 29a or the light-receiving part 29b can be vaporized by radiant heat from the lower wafer W heated by the PHT processing, thereby maintaining the detection sensitivity of the passage of the edge portion of the lower wafer W. In particular, if the received amount of the laser light (or red LED light) 1 falls below the predetermined threshold value as described above, the lower wafer W subjected to the PHT processing may be temporarily stopped when the lower wafer W passes between the light-emitting part 29*a* and the light-receiving part 29*b*. Accordingly, it is possible to sufficiently transfer radiant heat to the deposition adhered to the light-emitting part 29*a* or the light-receiving part 29*b*, so that the deposition can be securely vaporized and removed.

Figure 10:
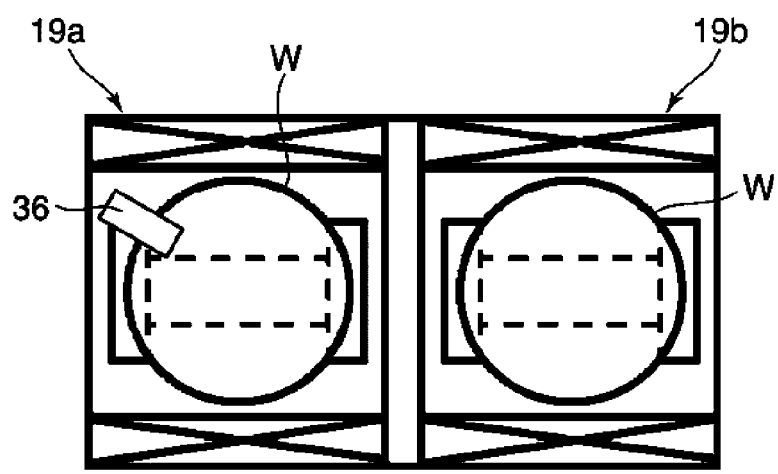
FIG. 10 is a view illustrating a height sensor disposed in a load lock module.

In addition, a height sensor 36 for measuring a height of the pick part 24*a* of the transfer arm 14*a*, in particular, a height of the wafer W mounted on the pick part 24*a* may be mounted on the load lock module 19*a* (FIG. 10). Therefore, it can be determined whether there is a possibility that the upper wafer W or the upper pick 24*at* of the pick part 24*a* interferes with the light-emitting part 29*a* of the lower wafer detection sensor 29 due to lowering of the location of the pick part 24*a* of the transfer arm 14*a*, which results from, for example, aging or an accident. Therefore, it is possible to prevent the upper wafer W and the like from interfering with the light-emitting part 29*a*.

Figure 11:
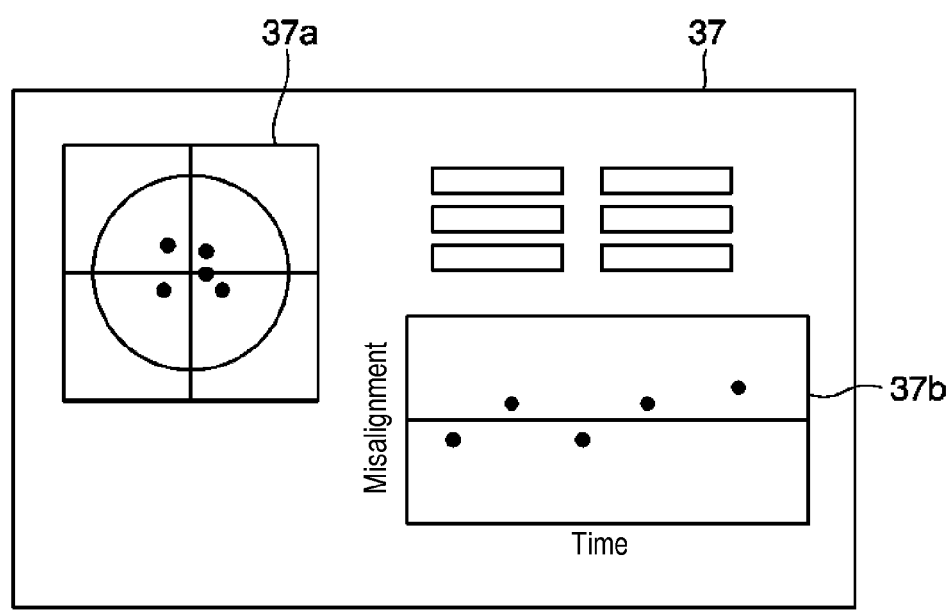
FIG. 11 is a view illustrating a monitor included in the substrate processing apparatus in FIG. 1.

Further, the substrate processing apparatus 10 may have a monitor 37 for displaying a specified position of each wafer W to a user (FIG. 11). The monitor 37 displays, for example, a graph 37*a* in which positional misalignment from an ideal position of each wafer W is represented by overlapping or a graph 37*b* in which the amount of positional misalignment from the ideal position of each wafer W is represented in time series. Accordingly, the user can understand a tendency of the positional misalignment and roughly estimate a cause of the occurrence of the positional misalignment, so that it is possible to quickly correct future positional misalignment.

Further, in the substrate processing apparatus 10, the lower wafer detection sensor 29 specifies the positions of two points of the lower wafer W and the upper wafer detection sensor 30 specifies the positions of two points of the upper wafer W. However, for example, an edge portion detection sensor different from the lower wafer detection sensor 29 may be provided in the region through which the lower wafer W passes so as to allow each of the lower wafer detection sensor 29 and the edge portion detection sensor to specify the position of one point of the lower wafer W. An edge portion detection sensor different from the upper wafer detection sensor 30 may be provided in the region through which the upper wafer W passes so as to allow each of the upper wafer detection sensor 30 and the edge portion detection sensor to specify the position of one point of the upper wafer W.

A storage medium on which program codes of software for implementing the functions of the embodiments are recorded is provided to the controller 26 included in the substrate processing apparatus 10 so that a CPU of the controller 26 reads and executes the program codes stored in the storage medium, thereby achieving the object of the present disclosure.

In this case, the program codes themselves read from the storage medium implements the functions of the embodiments, and the program codes and the storage medium storing the program codes constitute the present disclosure.

The storage medium for supplying the program codes may include any medium capable of storing the program codes therein, for example, a RAM, an NV-RAM, a floppy (registered trademark) disk, a hard disk, a magneto-optical disk, an optical disk such as a CD-ROM, a CD-R, a CD-RW, a DVD (DVD-ROM, DVD-RAM, DVD-RW, DVD+RW), a magnetic tape, a non-volatile memory card, other ROMs and the like. Alternatively, the program codes may be supplied to the controller 26 by downloading them from a database or another computer (not shown) connected to the Internet, a commercial network, a local area network or the like.

Furthermore, the functions of the embodiments can be implemented by executing the program codes read by the controller 26, and an OS (operating system) running on the CPU may perform a portion or all of actual processing based on instructions of the program codes so that the functions of the embodiments may be implemented by the processing.

Moreover, the program codes read from the storage medium may be written in a memory of a function extension board inserted into the controller 26 or a function extension unit connected to the controller 26, and a CPU provided in the function extension board or the function extension unit may perform a part or all of the actual processing based on the instructions of the program codes so that the functions of the embodiments may be implemented by the processing.

The program codes may be in the format of object codes, program codes executable by an interpreter, script data supplied to an OS, or the like.

According to the present disclosure, one of the light-emitting part and the light-receiving part of the lower substrate detection sensor is disposed to be placed between the lower substrate and the upper substrate when the lower substrate is transferred between one mounting able and the transfer chamber, and the other of the light-emitting part and the light-receiving part of the lower substrate detection sensor is disposed to face one of the light-emitting part and the light-receiving part with the substrate interposed between the light-emitting part and the light-receiving part, so that only the lower substrate passes between the light-emitting part and the light-receiving part of the lower substrate detection sensor. This allows the lower substrate detection sensor to detect the edge portion of the lower substrate irrespective of the presence of the upper substrate. In addition, since one of the light-emitting part and the light-receiving part of the lower substrate detection sensor is disposed in the region through which the lower substrate passes when the lower substrate is transferred, the edge portion of the lower substrate passes twice between the light-emitting part and the light-receiving part of the lower substrate detection sensor. Accordingly, it is possible to detect two points on the edge portion of the lower substrate. Furthermore, since the upper substrate detection sensor is disposed in the region through which the upper substrate passes when the upper substrate is transferred between the other mounting table and the transfer chamber, the edge portion of the upper substrate passes twice in front of the upper substrate detection sensor. Accordingly, it is possible to detect two points on the edge portion of the upper substrate. As a result, it is possible to accurately specify the position of each of the two substrates disposed in an overlapping state.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus having a transfer arm configured to transfer two substrates between a transfer chamber and a processing chamber having two mounting tables, the transfer arm holding the two substrates in a state where the two substrates overlap each other with a gap between the two substrates, the substrate processing apparatus comprising:
- a lower substrate detection sensor configured to detect two points on an edge of a lower substrate of the two substrates and specify positions of the two points when the lower substrate is transferred, the two points being different from each other; and
- an upper substrate detection sensor configured to detect an edge of an upper substrate of the two substrates when the upper substrate is transferred,
- wherein the transfer arm transfers the lower substrate between one of the mounting tables and the transfer chamber and transfers the upper substrate between the other of the mounting tables and the transfer chamber,
- the lower substrate detection sensor is an optical sensor having a light-emitting part and a light-receiving part,
- one of the light-emitting part and the light-receiving part is disposed in a region through which the lower substrate passes when the lower substrate is transferred, and is disposed to be placed between the lower substrate and the upper substrate,
- the other of the light-emitting part and the light-receiving part is disposed to face the one of the light-emitting part and the light-receiving part with the lower substrate interposed between the light-emitting part and the light-receiving part when the lower substrate is transferred,
- the upper substrate detection sensor is disposed in a region through which the upper substrate passes when the upper substrate is transferred, and
- the one of the light-emitting part and the light-receiving part is installed within a communication port communicating an interior of the transfer chamber with an interior of the processing chamber.

2. The substrate processing apparatus of claim 1, wherein one of the light-emitting part and the light-receiving part is disposed in a reduced pressure atmosphere.

3. The substrate processing apparatus of claim 1, further comprising a height sensor configured to measure a height of the transfer arm.

4. The substrate processing apparatus of claim 1, wherein the transfer arm transfers the two substrates through an opening provided between the processing chamber and the transfer chamber, and a width of the opening is smaller than a total width of the two substrates when the two substrates are horizontally arranged.

5. The substrate processing apparatus of claim 1, wherein the transfer arm moves the respective two substrates along curved routes.

6. The substrate processing apparatus of claim 1, wherein the communication port is surrounded by a flange,
- the lower substrate detection sensor is installed in a cup-shaped bracket, and the cup-shaped bracket is mounted on a sensor port formed on the flange,
- the one of the light-emitting part and the light-receiving part is held by a shim, and is bent in an L-shape to protrude from the bracket to an interior of the communication port, and
- the other of the light-emitting part and the light-receiving part is installed outside of and at a bottom of the bracket, and faces the one of the light-emitting part and the light-receiving part via a sensor window formed on the bracket.

* * * * *